United States Patent
Chang et al.

(10) Patent No.: US 6,445,003 B1
(45) Date of Patent: Sep. 3, 2002

(54) THIN FILM TRANSISTOR (TFT) TYPE OPTICAL DETECTING SENSOR

(75) Inventors: Youn Gyoung Chang; Jeong Hyun Kim, both of Kunpo; Se June Kim, Seoul; Jae Kyun Lee, Anyang, all of (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/562,446

(22) Filed: May 1, 2000

(30) Foreign Application Priority Data

May 11, 1999 (KR) .............................. 99-16743

(51) Int. Cl.[7] ................ H01L 29/04; H01L 31/20; H01L 31/036; H01L 31/0376
(52) U.S. Cl. ............................ 257/59; 257/444
(58) Field of Search ................ 257/59, 72, 257, 257/258, 443, 444, 225, 226, 233

(56) References Cited

U.S. PATENT DOCUMENTS

| | | | | |
|---|---|---|---|---|
| 5,510,916 A | * | 4/1996 | Takahashi | 359/67 |
| 5,648,674 A | * | 7/1997 | Weisfield et al. | 257/428 |
| 5,780,871 A | * | 7/1998 | De Boer et al. | 257/59 |
| 6,100,951 A | * | 8/2000 | Oversluizen et al. | 349/49 |

* cited by examiner

*Primary Examiner*—David Nelms
*Assistant Examiner*—David Nhu
(74) *Attorney, Agent, or Firm*—Long Aldridge & Norman LLP

(57) ABSTRACT

A TFT type optical detecting sensor includes a capacitor, a sensor TFT, and a switching TFT each having an active layer with a channel having an elongated width. The width of the channel of the sensor TFT is substantially defined by a distance of a side of the pixel excluding the switching source wire and sensor drain wire. The first electrode of the capacitor of the optical detecting sensor is electrically connected to the sensor gate electrode of the sensor TFT.

17 Claims, 4 Drawing Sheets

THIN FILM TRANSISTOR (TFT) TYPE OPTICAL DETECTING SENSOR

This application claims the benefit of Korean Patent Application No. 1999-16743, filed on May 11, 1999, which is hereby incorporated by reference for all purposes as if fully set forth herein.

BACKGROUND OF THE INVENTION

1. Field of the Invention

The present invention relates to an optical detecting sensor and, more particularly, to a thin film transistor (TFT) type optical detecting sensor.

2. Discussion of the Related Art

Generally, optical detecting sensors are used in facsimile, digital copying machines and fingerprint recognition systems as an image reader. In recent years, a TFT type optical detecting sensor has been suggested. The TFT changes its electrical characteristics depending upon the presence of light incident to the device. The TFT type optical detecting sensor is a system using such a characteristic.

FIG. 1 shows a plan view of a pixel of a conventional TFT type optical detecting sensor.

As shown in FIG. 1, an optical detecting sensor 100 comprises a window 8, through which light generated from a light source (not shown) passes, and a sensor TFT 6 for generating optical current by detecting the light which is transmitted through the window 8 and then reflected from an object (not shown) disposed on the optical detecting sensor 100.

Optical current generated from the sensor TFT 6 is stored in a storage capacitor 4 as charges, and the charges stored in the storage capacitor 4 are transmitted by a switching TFT 2 to an external driving circuit(not shown). In addition, a light shielding layer 9 for blocking light is formed over the semiconductor layer where the switching TFT 2 is located.

In addition, the storage capacitor 4 has a predetermined capacity to store light current generated in proportion to the intensity of light reflected from the object. Therefore, a predetermined area is required for the storage capacitor 4. The storage capacitor 4 comprises first and second capacitor electrodes 30 and 34 and a capacitor wire 30' connecting the first capacitor electrode 30 to the corresponding capacitor electrode of the adjacent pixel.

The above optical detecting sensor will be described more in detail hereinafter with reference to FIG. 2.

A first metal layer is deposited on a substrate 1, then patterned to form a switching gate electrode 20, a first capacitor electrode 30 and a sensor gate electrode 40 on regions corresponding to the switching TFT 2, the storage capacitor 4 and the sensor TFT 6, respectively.

A first insulating layer 32 is deposited on the substrate 1 while covering the switching gate electrode 20, the first capacitor electrode 30, and the sensor gate electrode 40.

An intrinsic amorphous silicon layer and a doped amorphous silicon layer are consecutively deposited on the first insulating layer 32, then patterned to form semiconductor layers 26 and 46 of the switching TFT 2 and the sensor TFT 6, respectively.

A second metal layer is then deposited to form switching source and switching drain electrodes 22 and 24 on the region of the switching TFT 2, a second capacitor electrode 34 on a region of the storage capacitor 4, and sensor source and sensor drain electrodes 42 and 44 on a region of the sensor TFT.

A second insulating layer 16, and a protecting layer 10 are formed to protect the switching TFT 2, the storage capacitor 4 and the sensor TFT 6 from external moisture or impact. A light shielding layer 18 is formed between the second insulating layer 16 and the protecting layer 10 to protect the switching TPT 2 from being activated or degraded by external light.

Since the sensor TFT 6 operates by optical current in an off-state, negative voltage is always applied to the sensor gate electrode 40 to maintain the off-state.

In the above described optical sensor, the window 8 is an essential part in order to transmit light from the light source to an object and an amount of light passing through the window 8 is one of the most important parameters affecting light efficiency. In addition, the higher the signal vs. noise ratio (S/N ratio), the clearer the image becomes.

However, in the above described optical sensor, since the capacitor wire 30', which is connected to the first capacitor electrode 30 in order to apply a voltage to the storage capacitor 4, covers a portion of light passing area, the area of the window is reduced, decreasing the amount of the light incident to the sensor TFT 6.

SUMMARY OF THE INVENTION

Accordingly, the present invention is directed to thin film transistor type photo sensor and method for fabricating the same that substantially obviates one or more of the problems due to limitations and disadvantages of the related art.

An object of the present invention is to provide a TFT type optical detecting sensor in which areas of a storage capacitor and a window are maximized, thereby improving a signal vs. noise ratio (S/N).

Another object of the present invention is to provide an optical detecting sensor which has a higher switching speed.

Additional features and advantages of the invention will be set forth in the description which follows, and in part will be apparent from the description, or may be learned by practice of the invention. The objectives and other advantages of the invention will be realized and attained by the structure particularly pointed out in the written description and the claims, as well as the appended drawings.

To achieve these and other advantages and in accordance with the purpose of the present invention, as embodied and broadly described, in a preferred embodiment. The invention provides a TFT type optical detecting sensor having a plurality of pixels, each pixel comprising a sensor drain wire and a switching source wire, each disposed on opposite sides of the pixel, a storage capacitor for storing charges, the storage capacitor comprising a first capacitor electrode and a second capacitor electrode, a switching TFT for directing the charges stored in the storage capacitor to an external system, the switching TFT comprising a switching gate electrode and switching source and drain electrodes each disposed along a side of the pixel in a substantially perpendicular direction to the direction along which the sensor drain wire is disposed, an area between the switching source and drain electrodes defining a switching TFT channel, a sensor TFT for generating optical current and supplying the optical current to the storage capacitor, the sensor TFT comprising a sensor gate electrode and sensor drain and source electrodes, and wherein the width of the channel of the switching TFT is substantially the same as by the length of a side of the pixel, excluding the widths of the switching source wire and sensor drain wire.

Also, the first capacitor electrode is electrically connected to the sensor gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiment of the present invention, an example of which is illustrated in the accompanying drawings.

Figure 1:
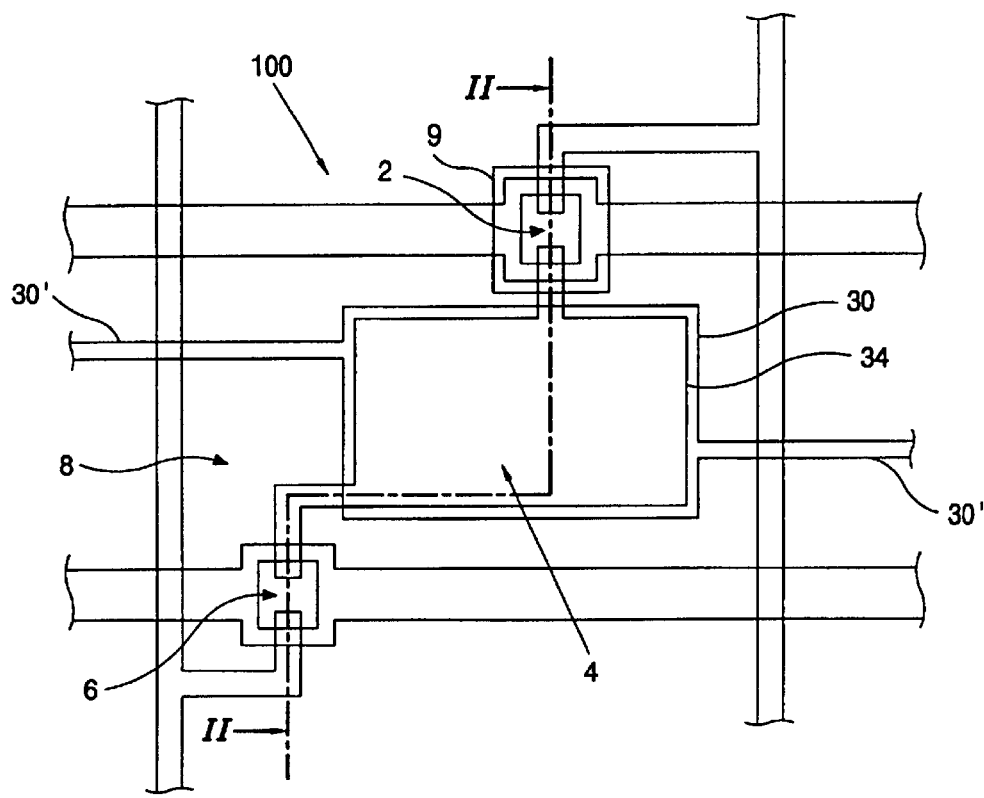
FIG. 1 is a plan view illustrating a pixel of a conventional optical detecting sensor.
Figure 2:
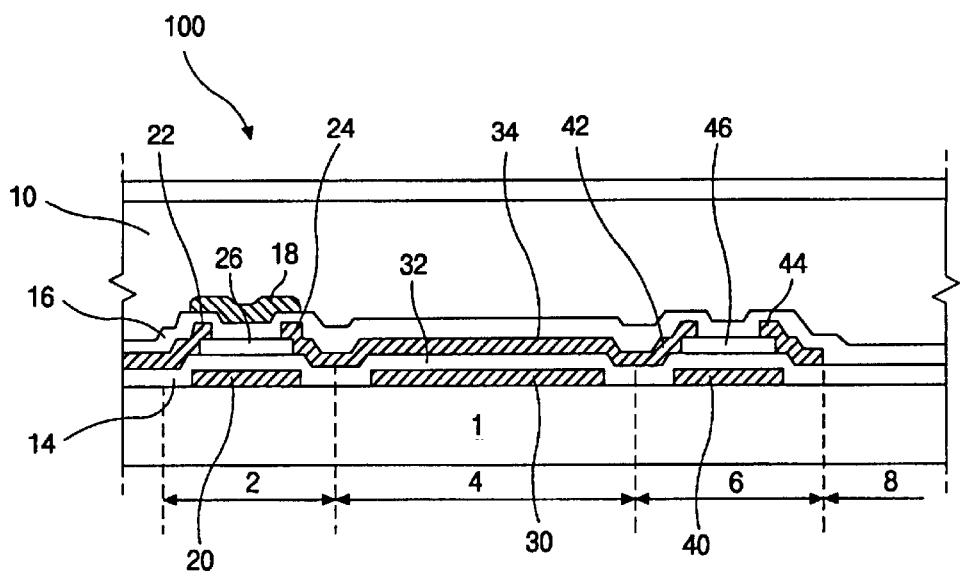
FIG. 2 is a sectional view taken along line II—II of FIG. 1.
Figure 3:
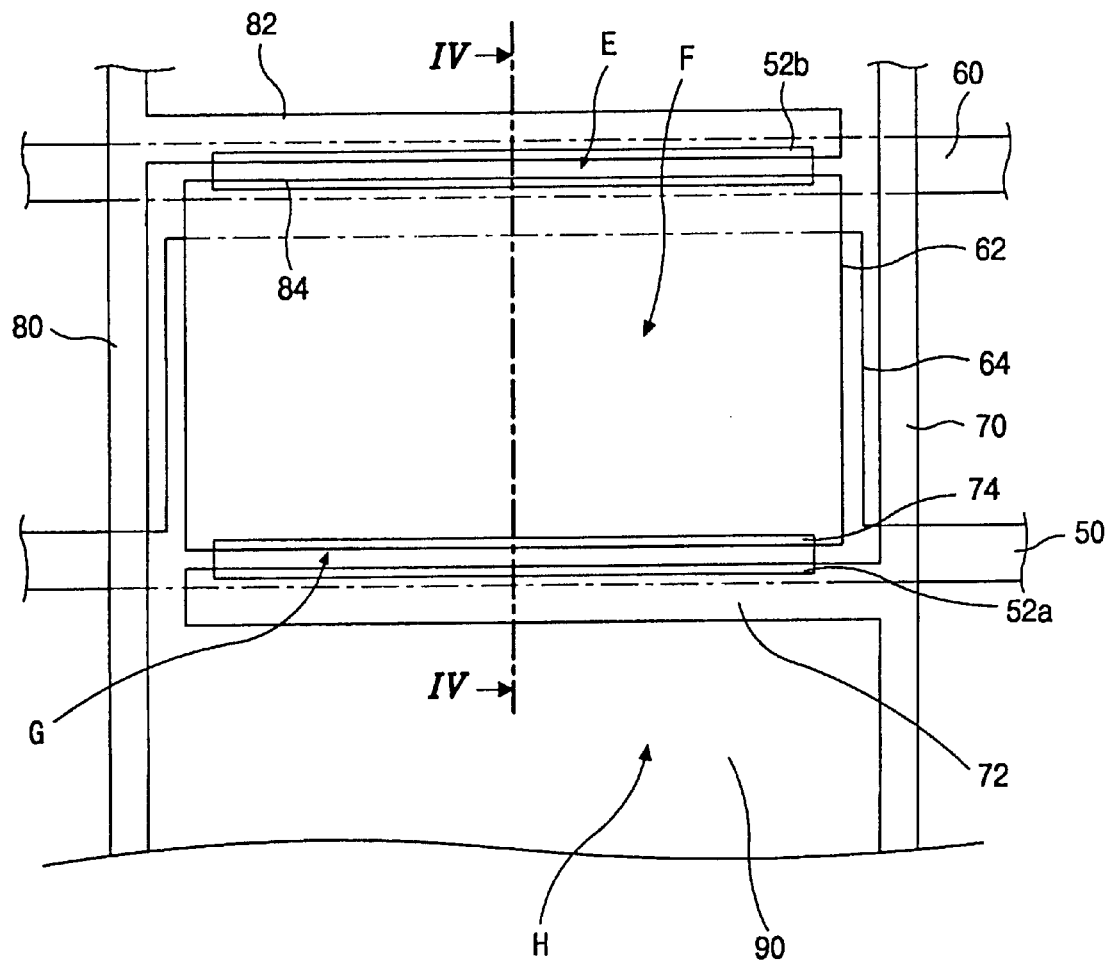
FIG. 3 is a plan view illustrating a pixel of a TFT type optical detecting sensor according to an embodiment of the present invention.

FIG. 3 shows a plan view illustrating a pixel of a TFT type optical detecting sensor according to a first embodiment of the present invention.

As shown in FIG. 3, a switching TFT E and a sensor TFT G are, respectively, each formed in parallel along opposing sides of a pixel, and a storage capacitor F is formed between the switching TFT E and sensor TFT G. A window H is defined on a region adjacent to the sensor TFT G.

The switching TFT E comprises a switching gate electrode 60, a semiconductor layer 52b, and switching source and drain electrodes 82 and 84, respectively. The switching source electrode 82 contacts a source wire 80 connected to a driving circuit, and the switching drain electrode 84 is connected to the storage capacitor F. The sensor TFT G comprises a sensor gate electrode 50, a semiconductor layer 52a, sensor source electrode 74, and sensor drain electrode 72. The sensor drain electrode 72 is connected to a sensor drain wire 70.

The storage capacitor F comprises a first capacitor electrode 64 connected to a sensor gate electrode 50 of the sensor TFT G, and a second capacitor electrode 62 connected to the switching drain electrode 84 of the switching TFT E. The second capacitor electrode 62 is also connected to the sensor source electrode 74. The storage capacitor F of the present invention does not have any capacitor wire connected to the first capacitor electrode as shown in FIG. 3, which also will be explained with reference to FIGS. 4a to 4d. Since the pixel has no capacitor wire, the window area H can be increased.

The channel of a TFT is defined as a path of the electrons in the active layer between the source and drain electrodes, and it is necessary to increase the channel width in order to improve the switching speed of the TFT. Since the sensor TFT G and the switching TFT E are disposed lengthwise along the side of the pixel, the channel widths of the sensor TFT G and the switching TFT E are increased. That is, as shown in FIG. 3, the sensor semiconductor layer 52a and the switching semiconductor layer 52b respectively are formed longitudinally along the side of the pixel, and the width of the semiconductor layers are substantially the same as one side of a pixel, excluding the widths of the sensor drain wire and switching source wire. Thus, the amount of optical current flowing along the channel of the sensor TFT G is increased, and the current of the switching TFT E is increased in an on-state. As a result, the field effect mobility is increased, improving the switching speed. In addition, since the amount of current generated in the sensor TFT G is increased, the signal-to-noise (SIN) ratio can be improved.

A method for making the above described sensor will be described hereinafter with reference to FIGS. 4a to 4d.

Figure 4A:
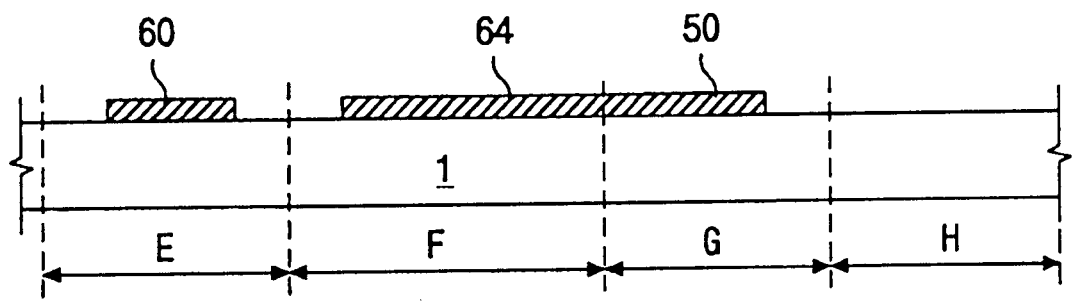
FIGS. 4a to 4d are sectional view taken along line IV—IV of FIG. 3 to illustrate a process for fabricating the optical detecting sensor.

First, as shown in FIG. 4a, a first metal layer is deposited on the substrate 1, then patterned to form the switching gate electrode 60 of the switching TFT E, the first capacitor electrode 64 of the storage capacitor F, and the sensor gate electrode 50 of the sensor TFT G. The first capacitor electrode 64 is electrically coupled to the sensor gate electrode 50. The first metal layer is made of a metal selected from the group consisting of Cr, Mo, Al, Ti, Sn, W and Cu.

Figure 4B:
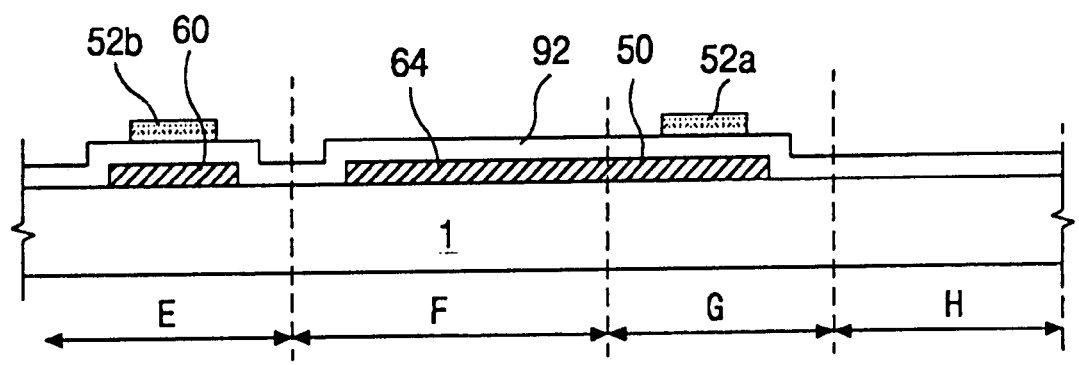

Next, as shown in FIG. 4b, a first insulating layer 92 is deposited on the substrate 1 and covering the first metal layer, then an intrinsic amorphous silicon layer and a doped amorphous silicon layer are consecutively deposited and patterned to form the switching semiconductor layer 52b and the sensor semiconductor layer 52a.

At this point, a portion of the first insulating layer 92 of the sensor TFT G and the switching TFT E functions as a gate insulating layer, and another portion of the first insulating layer functions as a dielectric material of the storage capacitor F.

Figure 4C:
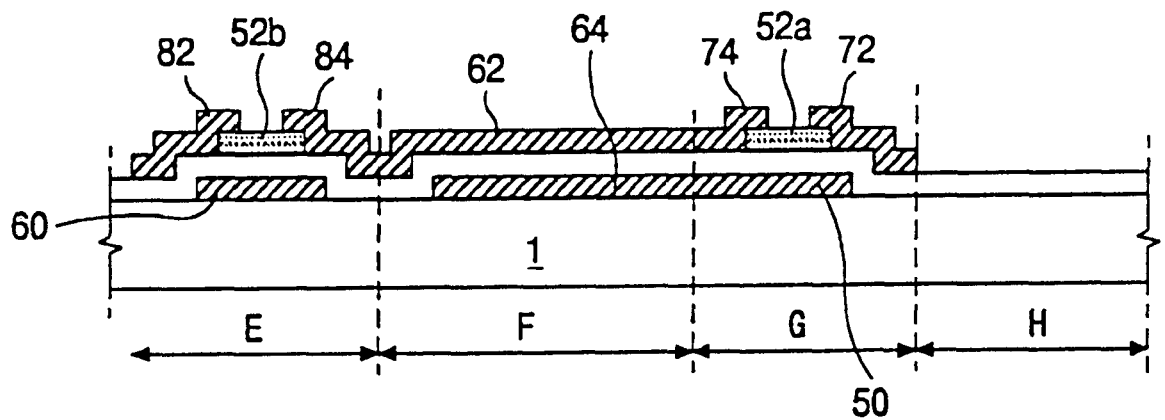

Next, as shown in FIG. 4c, a second metal layer is deposited and patterned to form switching source electrode 82 and drain electrode 84 of the switching TFT E, the second capacitor electrode 62 of the storage capacitor F, and sensor source and drain electrodes 74 and 72 of the sensor TFT G. The second metal layer is also made of a metal selected from the group consisting of Cr, Mo, Al, Ti, Sn, W and Cu.

Figure 4D:
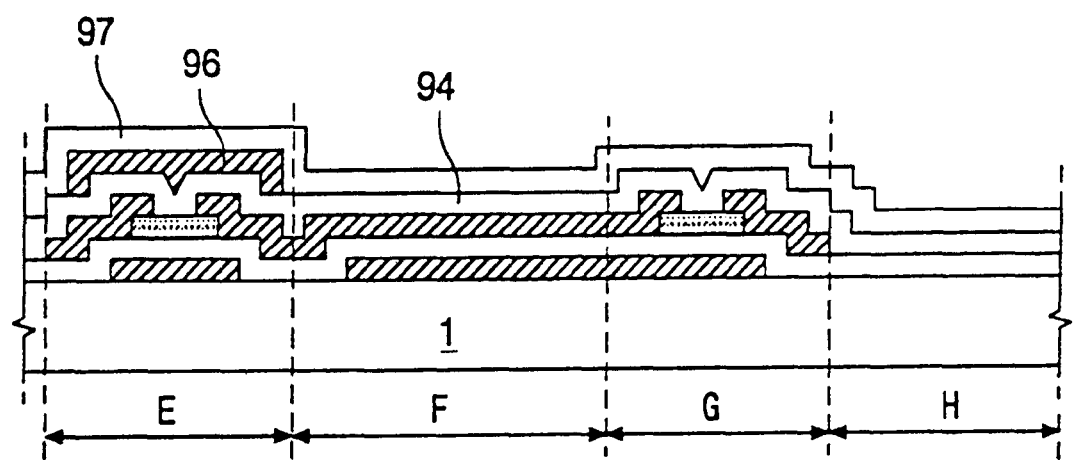

Next, as shown in FIG. 4d, a second insulating layer 94 is formed on the second metal layer to protect the elements E, F and G. The light shielding layer 96 is formed on the second insulating layer 94 to prevent the switching TFT E from being activated by external light or having degraded performance. The protecting layer 97 is then deposited on the light shielding layer 96 and the second insulating layer 94.

It will be apparent to those skilled in the art that various modifications and variations can be made in the thin film transistor type optical detecting device of the present invention without departing from the spirit or scope of the invention. Thus, it is intended that the present invention cover the modifications and variations of this invention provided they come within the scope of the appended claims and their equivalents.

What is claimed is:

1. A thin film transistor (TFT) type optical detecting sensor having a plurality of pixels, each pixel comprising:
    a sensor drain wire and a switching source wire, each disposed on opposite sides of the pixel;
    a storage capacitor for storing charges, the storage capacitor comprising a first capacitor electrode and a second capacitor electrode;
    a switching TFT for conducting the charges stored in the storage capacitor to an external system, the switching TFT comprising a switching gate electrode and switching source and drain electrodes, each disposed along a side of the pixel in a substantially perpendicular direction to a direction along which the sensor drain wire is disposed, an area between the switching source and drain electrodes defining a switching TFT channel; and a sensor TFT for generating optical current and supplying the optical current to the storage capacitor, the sensor TFT comprising a sensor gate electrode and sensor drain and source electrodes and, wherein a width of the channel of the switching TFT is substantially equal to a length of a side of the pixel, excluding a width of the switching source wire and a width of the sensor drain wire.

2. The TFT type optical detecting sensor of claim 1, wherein a width of the channel of the switching TFT is identical to a width of the channel of the sensor TFT.

3. The TFT type optical detecting sensor of claim 1, wherein the sensor gate electrode and sensor drain and source electrodes are each disposed along a side of the pixel in a substantially perpendicular direction to a direction along which the switching source wire is disposed.

4. The TFT type optical detecting sensor of claim 1, wherein the switching gate electrode and switching source and drain electrodes are disposed on an opposite side of the pixel with respect to the sensor gate electrode and sensor drain and source electrodes.

5. The TFT type optical detecting sensor of claim 1, wherein the first capacitor electrode is electrically connected to the sensor gate electrode.

6. The TFT type optical detecting sensor of claim 5, wherein the first capacitor electrode and the sensor gate electrode are made of a same material.

7. The TFT type optical detecting sensor of claim 5, wherein the second capacitor electrode is electrically connected to the sensor source electrode.

8. The TFT type optical detecting sensor of claim 7, wherein the second capacitor electrode is electrically connected to the switching drain electrode.

9. A thin film transistor (TFT) type optical detecting sensor, comprising:

a window through which light passes to an object;

a sensor TFT for generating optical current using light reflected from the object, the sensor TFT comprising first and second electrodes and a gate electrode;

a storage capacitor for storing charges of the optical current, the storage capacitor comprising first and second capacitor electrodes, the first capacitor electrode being made of a same material as and being directly connected to the sensor gate electrode; and a switching TFT for selectively conducting charges stored in the storage capacitor to an external component.

10. The TFT type optical detecting sensor of claim 9, wherein the second capacitor electrode is connected to the second electrode of the sensor TFT.

11. The TFT type optical detecting sensor of claim 10, wherein the switching TFT has a first electrode, a gate electrode, and a second electrode, and wherein the second capacitor electrode is connected to the second electrode of the switching TFT.

12. A thin film transistor (TFT) type optical detecting sensor, comprising:

a substrate;

a switching gate electrode, a sensor gate electrode, and a first capacitor electrode which are formed on the substrate, the first capacitor electrode being directly connected to the switching gate electrode;

a first insulating layer formed on the substrate and covering the switching gate electrode, the sensor gate electrode, and the first capacitor electrode;

switching and sensor semiconductor layers formed on the first insulating layer over the switching gate electrode and the sensor gate electrode, respectively;

switching source and drain electrodes formed on the switching semiconductor layer;

sensor source and drain electrodes formed on the sensor semiconductor layer;

a second capacitor electrode formed on the first insulating layer over the first capacitor electrode, the second capacitor electrode being electrically coupled to both the switching drain electrode and the sensor source electrode;

a second insulating layer formed on the substrate and covering each of the electrodes; a light shielding layer formed on the second insulating layer over the switching semiconductor layer; and a protecting layer formed on the light shielding layer and the second insulating layer.

13. A thin film transistor (TFT) type optical detecting sensor, comprising:

a sensor TFT having a first electrode, a gate electrode and a second electrode;

a switching TFT having a first electrode, a gate electrode and a second electrode; and a storage capacitor having a first electrode and a second electrode, the second electrode of the storage capacitor being connected to the first electrode of the sensor TFT and also being connected to the second electrode of the switching TFT, and the first electrode of the storage capacitor being directly connected to the gate electrode of the sensor TFT.

14. The thin film transistor (TFT) type optical detecting sensor of claim 12, wherein a length the switching source electrode is at least equal to a length of the second capacitor electrode.

15. The thin film transistor (TFT) type optical detecting sensor of claim 12, wherein a length the sensor drain electrode is at least equal to a length of the second capacitor electrode.

16. The thin film transistor (TFT) image sensor of claim 13, wherein a length the switching TFT drain electrode is at least equal to a length of the second capacitor electrode.

17. The thin film transistor (TFT) image sensor of claim 13, wherein a length the sensor TFT source electrode is at least equal to a length of the second capacitor electrode.

* * * * *